United States Patent
Mazumder

(10) Patent No.: US 8,963,597 B1
(45) Date of Patent: Feb. 24, 2015

(54) CROSS-DOMAIN ENABLEMENT METHOD AND ELECTRONIC APPARATUS

(71) Applicant: Nanya Technology Corporation, Tao-Yuan Hsien (TW)

(72) Inventor: Kallol Mazumder, Plano, TX (US)

(73) Assignee: Nanya Technology Corporation, Tao-Yuan (TW)

( * ) Notice: Subject to any disclaimer, the term of this patent is extended or adjusted under 35 U.S.C. 154(b) by 0 days.

(21) Appl. No.: 14/043,860

(22) Filed: Oct. 2, 2013

(51) Int. Cl.
*H03L 7/06* (2006.01)
*H03L 7/08* (2006.01)

(52) U.S. Cl.
CPC .................. *H03L 7/0802* (2013.01)
USPC .................. 327/158; 327/149; 327/153

(58) Field of Classification Search
USPC .............. 327/141, 144–163; 331/15–17; 375/373–376
See application file for complete search history.

(56) References Cited

U.S. PATENT DOCUMENTS

| | | | | |
|---|---|---|---|---|
| 7,212,465 B2 * | 5/2007 | Kang | ............................. | 365/193 |
| 7,616,037 B2 * | 11/2009 | Cho | ............................. | 327/158 |
| 2001/0047464 A1 * | 11/2001 | Shinozaki | ..................... | 711/167 |
| 2008/0008283 A1 * | 1/2008 | Lee | ................. | 375/375 |
| 2008/0056057 A1 * | 3/2008 | Kim et al. | ................. | 365/233.1 |
| 2010/0244915 A1 * | 9/2010 | Kwon et al. | ................. | 327/158 |
| 2014/0002154 A1 * | 1/2014 | Jang et al. | ..................... | 327/158 |
| 2014/0005183 A1 * | 1/2014 | Galatsis et al. | ............ | 514/228.5 |

* cited by examiner

*Primary Examiner* — Brandon S Cole
(74) *Attorney, Agent, or Firm* — CKC & Partners Co., Ltd.

(57) ABSTRACT

A cross-domain enablement method is configured for providing a local clock signal to a logic-circuit device, which is operated in a delay-locked loop (DLL) domain. The logic-circuit device includes a command input and a clock input. The cross-domain enablement method comprises steps of: starting to provide the local clock signal to the clock input of the logic-circuit device by enabling a clock signal in the DLL-domain when a first command signal in a clock domain is activated; and, providing a second command signal in the DLL-domain to the command input of the logic-circuit device. The second command signal in the DLL-domain is activated later than the first command signal in the clock domain.

20 Claims, 4 Drawing Sheets

CROSS-DOMAIN ENABLEMENT METHOD AND ELECTRONIC APPARATUS

BACKGROUND

1. Field of Invention

The present application relates to a controlling method on an electronic device. More particularly, the present application relates to an enablement method on an electronic apparatus for power-saving.

2. Description of Related Art

In order to achieve better durability and generate less heat, the electronic device must be operated at a lower power. Power consumption is now a critical issue whiling designing an electronic device. However, the designers may face a conflict when they are trying to lower the power consumption and maintain the high processing speed/performance on the electronic device at the same time.

For example, in a traditional design of a shifter circuit, the shifter circuit receives a free-running clock signal, which keeps running all time no matter the shifter circuit is activated or suspended. The free-running clock signal alternates between low/high levels periodically, and charges/discharges the capacitance within the shifter circuit even when the shifter circuit is not working. In this case, the free-running clock signal will cause unnecessary power waste on the shifter circuit. In order to reduce the power consumption, the free-running clock signal can no longer be used in the shifter circuit which is power hungry.

Therefore, it is important to establish an enablement manner, such that the electronic apparatus may be operated at high performance with low power consumption at the same time.

SUMMARY

An aspect of the present disclosure is to provide a cross-domain enablement method configured for providing a local clock signal to a logic-circuit device operated in a delay-locked loop (DLL) domain. The logic-circuit device includes a command input and a clock input. The cross-domain enablement method comprising: starting to provide the local clock signal to the clock input of the logic-circuit device by enabling a clock signal in the DLL-domain when a first command signal in a clock domain is activated; and, providing a second command signal in the DLL-domain to the command input of the logic-circuit device, wherein the second command signal in the DLL-domain is activated later than the first command signal in the clock domain.

Another aspect of the present disclosure is to provide an electronic apparatus which includes a logic-circuit device, a controller module and a cloned delay line. The logic-circuit device is operated in a delay-locked loop (DLL) domain. The logic-circuit device includes a command input and a clock input. The controller module is configured to start providing a local clock signal to the clock input of the electronic apparatus by enabling a clock signal in the DLL-domain when a first command signal in a clock domain is activated. The cloned delay line is configured for delaying the first command signal in the clock domain to form a second command signal in the DLL-domain. The second command signal in the DLL-domain is provided to the command input of the electronic apparatus. The clock-domain command bypasses the cloned delay line and arrives at the logic-circuit earlier than the DLL-domain command and hence enables the local-clock earlier than the arrival of the DLL-domain command.

BRIEF DESCRIPTION OF THE DRAWINGS

The disclosure can be more fully understood by reading the following detailed description of the embodiments, with reference made to the accompanying drawings as follows.

DETAILED DESCRIPTION

In order to reduce the power consumption, the free-running clock signal can no longer be used in the shifter circuit which is power hungry. Instead of applying the free-running clock signal to the shifter circuit, the shifter circuit requires a local clock signal, which can be activated when there is information needed to be shifted and can be shut down when the shifting process is complete. The local clock signal is used to enable to the shifter circuit only when the shifting process is needed (e.g., when there is an incoming command of the shifting process).

There are some designs for providing the local (enabling) clock signals. For example, FF (flip-flop)-chains approach or sliver-resistant shifters approach can be used for providing the local clock signal, and both approaches are confined in a single domain (e.g., clock domain).

In the FF-chains approach, the local (enabling) clock signal must be shifted multiple clocks before the shifter circuit is activated (the operation command is inputted), such that it incurs integral cycles of wakeup delay (because the operation of the shifter circuit must wait until the local clock signal is ready). In the sliver-resistant shifters approach, there is still a certain number of shifters must be operated under the free-running clock signals, such that the sliver-resistant shifters approach is not an ideal solution because some power is still wasted. Therefore, the disclosure provides a cross-domain enablement method for an electronic apparatus to eliminate aforesaid issues.

Figure 1:
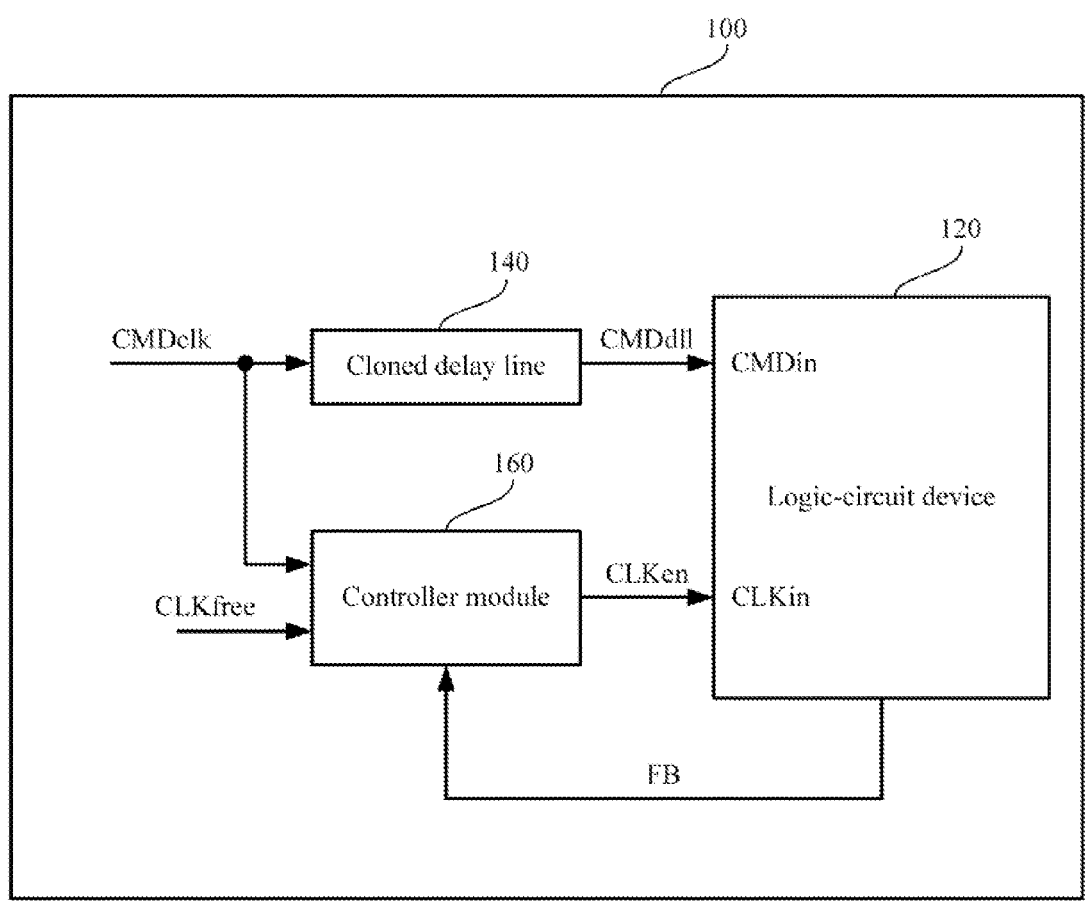
FIG. 1 is a schematic diagram illustrating an electronic apparatus according to an embodiment of this disclosure.

Reference is made to FIG. 1. FIG. 1 is a schematic diagram illustrating an electronic apparatus 100 according to an embodiment of this disclosure. The electronic apparatus 100 comprises a logic-circuit device 120, a cloned delay line 140 and a controller module 160. In this embodiment, the logic-circuit device 120 is configured to represent a clock-based logic-circuit component operated in a delay-locked loop (DLL) domain in the electronic apparatus 100. For example, the logic-circuit device 120 can be shifter stages, a memory module, a register module, or any equivalent circuit which has clock-based logic and operates according to a DLL-domain clock signal.

Figure 2:
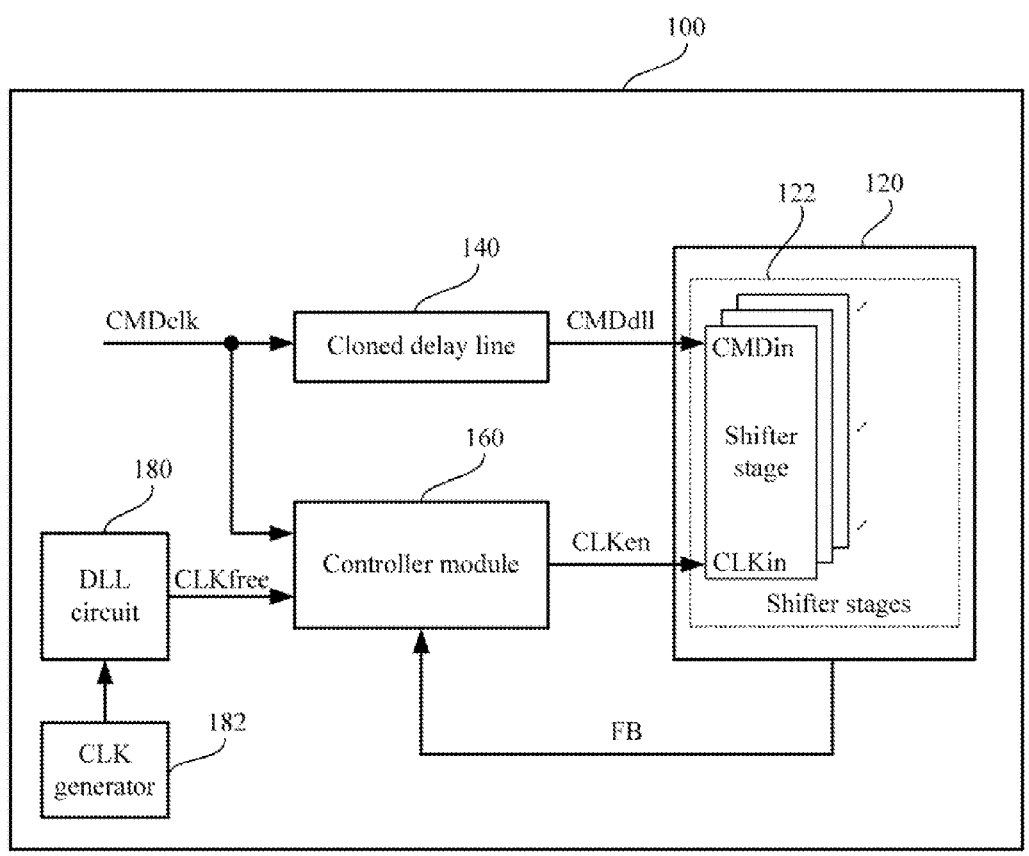
FIG. 2 is a schematic diagram illustrating further details of the electronic apparatus according to an embodiment of this disclosure.

The logic-circuit device 120 has a command input CMDin and a clock input CLKin. Reference is also made to FIG. 2. FIG. 2 is a schematic diagram illustrating further details of the electronic apparatus 100 according to an embodiment of this disclosure. In the embodiment shown in FIG. 2, the logic-circuit device 120 can include multiple shifter stages 122. For example, each shifter stage can be a flip-flop shifter, but the disclosure is not limited thereto. In some embodiments, the shifter stages 122 can be read shifter stages or write shifter stages or On Die Termination (ODT) shifter stages.

In order to operate/drive the logic-circuit device 120 properly, the electronic apparatus is required to provide the DLL-domain clock signal to the clock input CLKin of the logic-circuit device 120. In the embodiment of the electronic apparatus 100, the controller module 160 is configured for providing a local clock signal CLKen (which is in the DLL-domain) to the clock input CLKin of the logic-circuit device 120. To be noticed that, the local clock signal CLKen is not a free-running clock signal. In other words, the local clock signal CLKen is not all-time enabled (i.e., does not oscillates all the time), and the controller module 160 only provides the local clock signal CLKen during an enabled period of the logic-circuit device 120. The details are disclosed in following embodiments.

Figure 3:
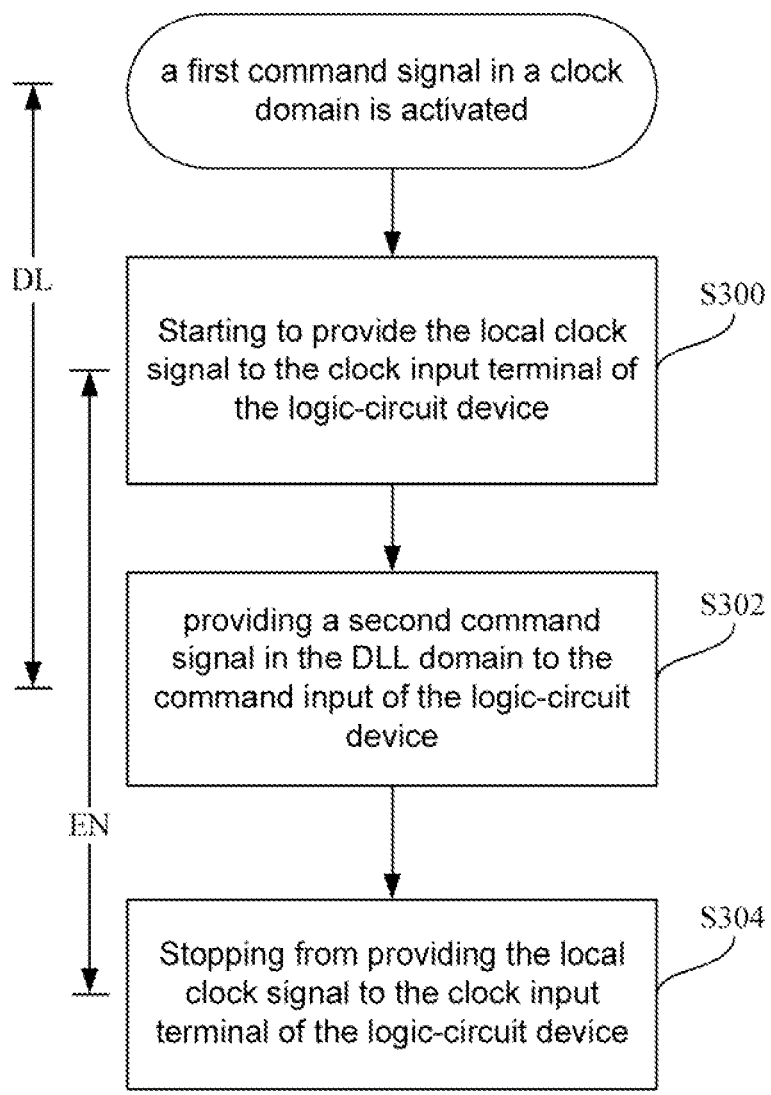
FIG. 3 is a flow chart illustrating a cross-domain enablement method according to an embodiment in the disclosure.
Figure 4:
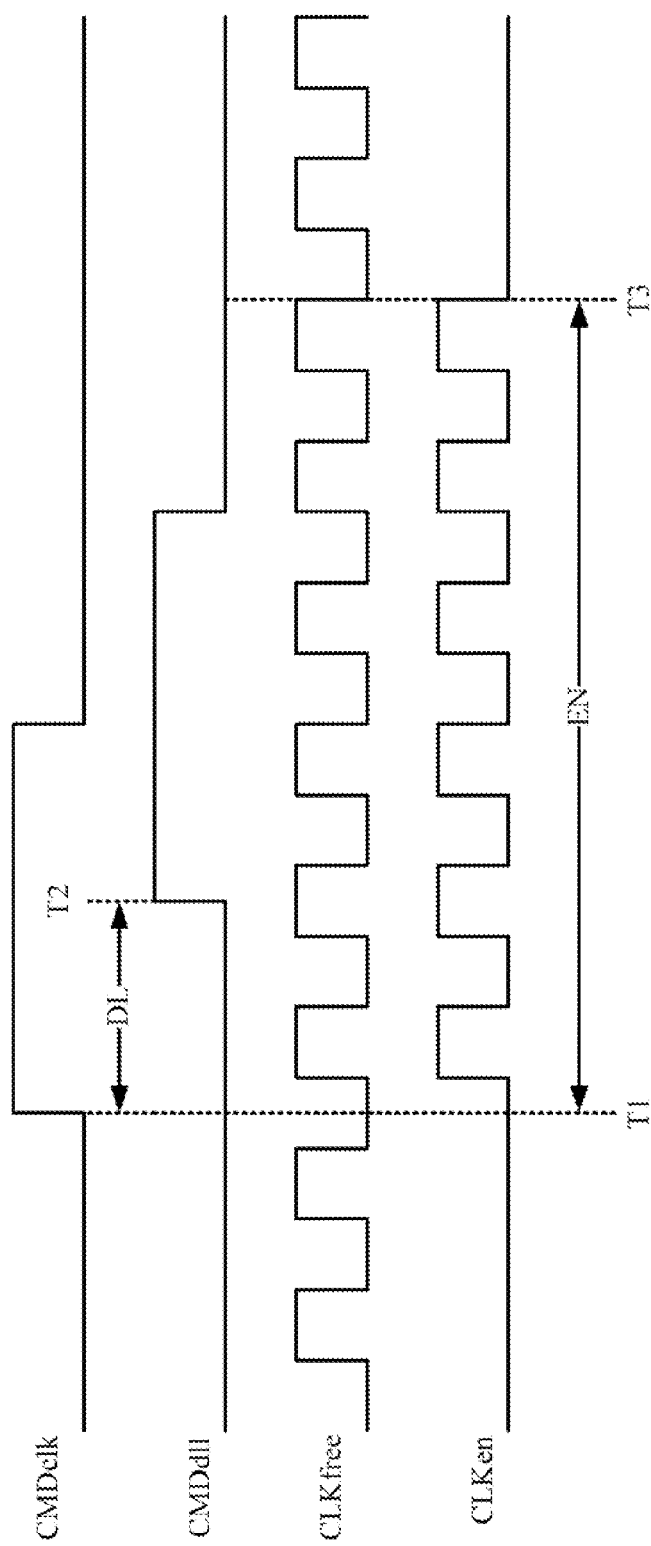
FIG. 4 is a waveform diagram illustrating related signals according to an embodiment of the disclosure.

Reference is also made to FIG. 3 and FIG. 4. FIG. 3 is a flow chart illustrating a cross-domain enablement method according to an embodiment in the disclosure. The cross-domain enablement method is configured for providing the local clock signal (e.g., the local clock signal CLKen in FIG. 1-2) to the logic-circuit device (e.g., the logic-circuit device 120 in FIG. 1-2) operated in the delay-locked loop (DLL) domain. FIG. 4 is a waveform diagram illustrating related signals according to an embodiment of the disclosure.

As shown in FIGS. 2, 3 and 4A, when a first command signal COMclk in the clock domain is activated at time point T1, step S300 is executed, and the controller module 160 starts to provide the local clock signal CLKen to the clock input CLKin of the logic-circuit device 120. In step S300, the local clock signal CLKen is generated by gating the clock signal CLKfree in the DLL-domain (as shown in FIG. 4) with the cross-domain enabling signal CMDclk.

In this embodiment, the clock signal CLKfree is a free-running clock signal in the DLL-domain. As shown in FIG. 2, the electronic apparatus 100 may further comprises a delay-locked loop circuit 180 and a clock generator 182. The clock generator 182 can be used to generate a system clock signal in clock domain. In general, the delay-locked loop circuit 180 is configured to control the time-synchronization between different circuits or components in the same system. The delay-locked loop circuit 180 is configured for synchronizing the logic-circuit device 120 with other circuits (not shown in figures) in the electronic apparatus 100. The system clock signal in the clock domain generated by the clock generator 182 is processed by the delay-locked loop circuit 180 into the clock signal CLKfree in the DLL-domain.

After time point T1, the controller module 160 starts gating the clock signal CLKfree with the first command signal CMDclk, so as to form the local clock signal CLKen to the clock input CLKin of the logic-circuit device 120 (referring to FIG. 4). In this case, the local clock signal CLKen is in the DLL-domain and triggered by the first command signal CMDclk in the clock domain.

Afterwards, step S302 is executed for providing a second command signal CMDdll in the DLL-domain to the command input CMDin of the logic-circuit device 120. The second command signal CMDdll in the DLL-domain is activated at time point T2, which is later than the activation of the first command signal CMDclk in the clock domain.

In this case, the first command signal CMDclk in the clock domain is delayed by the cloned delay line 140 to form the second command signal CMDdll in the DLL-domain. The time delay DL between the time points T1 and T2 is formed by the cloned delay line 140 by matching an actual delay time between clock/DLL-domains in the delay-locked loop circuit. The contents of the first command signal CMDclk and the second command signal CMDdll are the same, but two command signals are activated at different timings. In other words, the first command signal CMDclk in the clock domain and the second command signal in the DLL-domain have identical waveforms with the time delay DL in-between. In the embodiment, the first command signal CMDclk and the second command signal CMDdll can be reading commands, writing commands or On Die Termination (ODT) commands.

The local clock signal CLKen is triggered and formed right after the first command signal CMDclk being activated, and the second command signal CMDdll is delayed by the cloned delay line 140, such that the enabling clock signal (i.e., the local clock signal CLKen) will enable the function of the logic-circuit device 120 in advance, before the second command signal CMDdll is activated to trigger the logic-circuit device 120. In other words, the local clock signal CLKen will always arrive at the logic-circuit device 120 before the second command signal CMDdll in DLL-domain, such that the logic-circuit device 120 may operate according to the local clock signal CLKen on correct timing.

Afterwards, step S304 is executed for stopping from providing the local clock signal to the clock input of the logic-circuit device. In the embodiment shown in FIGS. 2 and 4A, when the second command signal is shifted out completely from the shifter stages 122 of the logic-circuit device 120 at time point T3, the logic-circuit device 120 may return a feedback signal FB (referring to FIG. 2) to the controller module 160. In response to the feedback signal FB, the controller module 160 stops from providing the local clock signal CLKen to the clock input CLKin of the logic-circuit device 120.

In this case, the controller module 160 provides the local clock signal CLKen to the logic-circuit device 120 during the enabling period EN (started from T1 until T3) of the logic-circuit device 120. In this case, the logic-circuit device 120 may receive the local clock signal CLKen at the time point T1 right before the second command signal CMDdll comes, until the time point T3 as the second command signal CMDdll is shifted out completely from the shifter stages.

Therefore, the logic-circuit device 120 only receives the local clock signal CLKen when it is necessary. The local clock signal is in the DLL-domain and triggered by the first command signal in the clock domain, so as to realize the cross-domain enablement of the clock input on the logic-circuit device 120. The cross-domain enablement method and the related circuit (including the controller module and the cloned delay line) can be realized easily or constructed by simple circuit components.

On the other hand, the local clock signal CLKen is deactivated outside the enabling period EN (the logic-circuit device 120 receives no clock input), such that the local clock signal CLKen will not consume unnecessary power by charging/discharging an intrinsic capacitance (not shown in figures) within the logic-circuit device 120.

In the embodiment in FIG. 4, providing the local clock signal is stopped at the time point T3 when the second command signal is shifted out completely from the shifter stages 122 of the logic-circuit device 120 at time point T3. However, the disclosure is not limited to this.

The local clock signal is in the DLL-domain and triggered by the first command signal in the clock domain, so as to realize the cross-domain enablement of the clock input on the logic-circuit device 120. The cross-domain enablement method and the related circuit (including the controller module and the cloned delay line) can be realized easily or constructed by simple circuit components, and unnecessary power consumption can be reduced.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims.

What is claimed is:

1. A cross-domain enablement method, configured for providing a local clock signal to a logic-circuit device operated in a delay-locked loop (DLL) domain, the logic-circuit device comprising a command input and a clock input, the cross-domain enablement method comprising:
   starting to provide the local clock signal to the clock input of the logic-circuit device by enabling a clock signal in the DLL-domain when a first command signal in a clock domain is activated; and
   providing a second command signal in the DLL-domain to the command input of the logic-circuit device, wherein the second command signal in the DLL-domain is activated later than the first command signal in the clock domain.

2. The cross-domain enablement method of claim 1, comprising:
   stopping from providing the local clock signal to the clock input of the logic-circuit device after the second command signal in the clock domain is deactivated.

3. The cross-domain enablement method of claim 1, wherein the logic-circuit device comprises a plurality of shifter stages, the cross-domain enablement method comprises:
   stopping from providing the local clock signal to the clock input of the logic-circuit device when the second command signal is shifted out completely from the shifter stages.

4. The cross-domain enablement method of claim 3, wherein the shifter stages are read shifter stages or write shifter stages or On Die Termination (ODT) shifter stages.

5. The cross-domain enablement method of claim 1, wherein the local clock signal is in the DLL-domain and triggered by the first command signal in the clock domain.

6. The cross-domain enablement method of claim 1, wherein the first command signal in the clock domain and the second command signal in the DLL-domain have identical waveforms with a time delay in-between.

7. The cross-domain enablement method of claim 1, wherein the first command signal and the second command signal are read commands, write commands or On Die Termination (ODT) commands.

8. The cross-domain enablement method of claim 1, wherein the step of providing the second command signal in the DLL-domain comprises:
   delaying the first command signal in the clock domain by a cloned delay line to form the second command signal in the DLL-domain.

9. The cross-domain enablement method of claim 8, wherein the cloned delay line is a cloned circuit for matching an actual delay time in a delay-locked loop circuit.

10. The cross-domain enablement method of claim 8, wherein the clock signal is a free-running clock signal in the DLL-domain.

11. An electronic apparatus, comprising:
   a logic-circuit device, operated in a delay-locked loop (DLL) domain, the logic-circuit device comprising a command input and a clock input;
   a controller module, configured to start providing a local clock signal to the clock input of the logic-circuit device by enabling a clock signal in the DLL-domain when a first command signal in a clock domain is activated; and
   a cloned delay line, configured for delaying the first command signal in the clock domain to form a second command signal in the DLL-domain, wherein the second command signal in the DLL-domain is provided to the command input of the logic-circuit device.

12. The electronic apparatus of claim 11, wherein the controller module stops from providing the local clock signal to the clock input of the logic-circuit device after the second command signal in the DLL-domain has exited the logic-circuit device at the end of the shift operation.

13. The electronic apparatus of claim 11, wherein the logic-circuit device comprises a plurality of shifter stages, the controller module stops from providing the local clock signal to the clock input of the logic-circuit device when the second command signal is shifted out completely from the shifter stages.

14. The electronic apparatus of claim 13, wherein the shifter stages are read shifter stages or write shifter stages or On Die Termination (ODT) shifter stages.

15. The electronic apparatus of claim 11, wherein the local clock signal is in the DLL-domain and triggered by the first command signal in the clock domain.

16. The electronic apparatus of claim 11, wherein the first command signal in the clock domain and the second command signal in the DLL-domain have identical waveforms with a time delay in-between.

17. The electronic apparatus of claim 11, wherein the first command signal and the second command signal are reading commands, writing commands or On Die Termination (ODT) commands.

18. The electronic apparatus of claim 11, further comprising:
   a delay-locked loop (DLL) circuit, configured for synchronizing the logic-circuit device with other circuits in the electronic apparatus, wherein the clock signal in the DLL-domain is generated by the delay-locked loop circuit.

19. The electronic apparatus of claim 18, wherein the cloned delay line is a cloned circuit for matching an actual delay time in the delay-locked loop circuit.

20. The electronic apparatus of claim 18, wherein the clock signal is a free-running clock signal in the DLL-domain.

* * * * *